(12) United States Patent
Hino

(10) Patent No.: US 6,411,170 B2
(45) Date of Patent: Jun. 25, 2002

(54) OSCILLATION CIRCUIT

(75) Inventor: Takuo Hino, Hirakata (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/775,825

(22) Filed: Feb. 5, 2001

(30) Foreign Application Priority Data

Feb. 10, 2000 (JP) ........................................ 2000-033794

(51) Int. Cl.[7] ................................................ H03B 5/12
(52) U.S. Cl. ................................... 331/117 R; 331/132
(58) Field of Search ........................... 331/115, 117 R, 331/117 FE, 117 D, 116 R, 116 FE, 132

(56) References Cited

U.S. PATENT DOCUMENTS 4,597,068 A * 6/1986 Miller .......................... 367/87
4,833,427 A * 5/1989 Leuthold et al. ............. 331/165

OTHER PUBLICATIONS

Pipilos, Spyros, Yannis P. Tsividus, Josef Fenk, and Yannis Papananos. "A Si 1.8 GHz RLC Filter with Tunable Center Frequency and Quality Factor." IEEE Journal of Solid–State Circuits. vol. 31, No. 10, pp. 1517–1525, Oct. 1996.

* cited by examiner

Primary Examiner—David Mis
(74) Attorney, Agent, or Firm—Stevens, Davis, Miller & Mosher, LLP

(57) ABSTRACT

In order to provide an oscillation circuit that is capable of achieving stable oscillation over a large frequency range, oscillating operation is carried out by connecting an LC resonance circuit, of which resonance frequency is adjustable, to the collector of a pair of transistors that function as 3-terminal active element, and feeding back the resonance signal of the LC resonance circuit to the base of the pair of transistors. At this time, a voltage appearing across both terminals of the LC resonance circuit is converted into a current by a Q-factor tuning voltage-current converter circuit, and the current is fedback to the LC resonance circuit thereby changing the Q factor of the LC resonance circuit.

13 Claims, 12 Drawing Sheets

Fig. 8
(a) 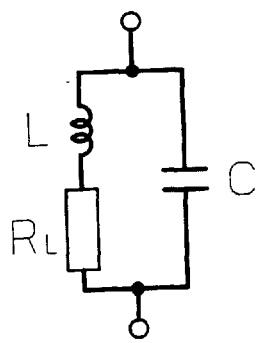
(b) 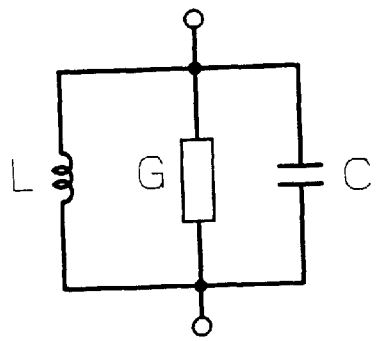
(c) 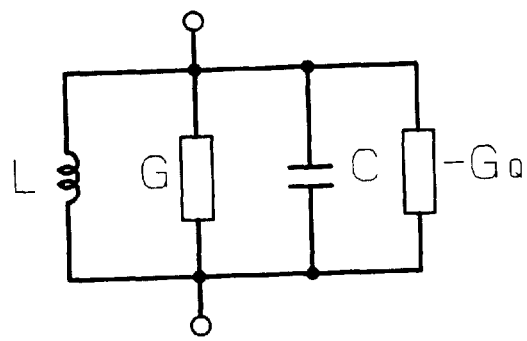
(d)  (e) 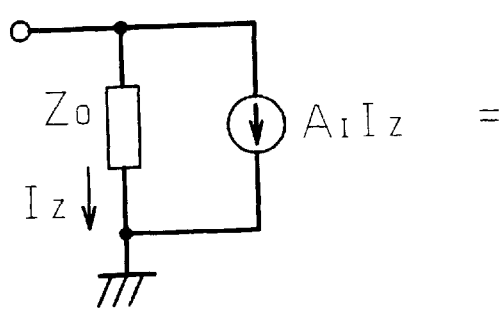

OSCILLATION CIRCUIT

BACKGROUND OF THE INVENTION

1. Field of the Invention

The present invention relates to an oscillation circuit used in high-frequency circuits of various communication equipment such as BS tuner, digital TV tuner and cellular telephone.

2. Description of the Related Art

FIG. 12 shows an example of circuit diagram of an oscillation circuit having differential configuration of the prior art. This oscillation circuit has such a configuration as one terminal of a current source $I_{1N}$ is connected to a power terminal to which a power voltage $V_{CC}$ is applied, and one terminal each of inductance elements $L_1$, $L_2$ is connected to other terminal of the current source $I_{1N}$. The other terminals of the inductors $L_1$, $L_2$ are connected to anode terminals of varactor diodes $C_{11}$, $C_{21}$ used as adjustable capacitance elements, and cathode terminals of the varactor diodes $C_{11}$, $C_{21}$ are connected with each other while a frequency tuning voltage $V_{TX}$ is applied thereto. The inductance elements $L_1$, $L_2$ and the varactor diodes $C_{11}$, $C_{21}$ constitute an LC resonance circuit $RC_3$.

Junction of the inductance element $L_1$ and the varactor diode $C_{11}$ is connected to the collector of a bipolar transistor (hereafter referred to as transistor) $T_{IN1}$ which is a 3-terminal active element, while the emitter of the transistor $T_{IN1}$ is grounded via an emitter resistor $R_{E1}$. Junction of the inductance element $L_2$ and the varactor diode $C_{21}$ is connected to the collector of a transistor $T_{IN2}$ which is a 3-terminal active element, while the emitter of the transistor $T_{IN2}$ is grounded via an emitter resistor $R_{E2}$. The base of the transistor $T_{IN1}$ is connected to the collector of the transistor $T_{IN2}$, and the base of the transistor $T_{IN2}$ is connected to the collector of the transistor $T_{IN1}$.

Junction of the inductance element $L_1$, the varactor diode $C_{11}$, and the transistor $T_{IN1}$ is connected to the base of the transistor $Q_{P1}$ that constitutes an emitter follower circuit. Collector of the transistor $Q_{P1}$ is connected to a power terminal, while the emitter is grounded via a current source $I_{P1}$ and is, at the same time, connected to the base of a transistor $Q_{P2}$ that constitutes the emitter follower circuit. Collector of the transistor $Q_{P2}$ is connected to the power terminal, while the emitter is grounded via a current source $I_{P2}$, so that one of oscillation outputs $V_{OUT}$ (+) is obtained at the emitter of the transistor $Q_{P2}$.

Junction of the inductance element $L_2$, the varactor diode $C_{21}$, and the transistor $T_{IN2}$ is connected to the base of the transistor $Q_{N1}$ that constitutes an emitter follower circuit. Collector of the transistor $Q_{N1}$ is connected to a power terminal, while the emitter is grounded via a current source $I_{N1}$ and is, at the same time, connected to the base of a transistor $Q_{N2}$ that constitutes the emitter follower circuit. Collector of the transistor $Q_{N2}$ is connected to the power terminal, while the emitter is grounded via the current source $I_{N2}$, so that the other oscillation outputs $V_{OUT}$ (−) is obtained at the emitter of the transistor $Q_{N2}$.

In the oscillation circuit having such a constitution as described above, the inductance elements $L_1$, $L_2$ and the varactor diodes $C_{11}$, $C_{21}$ constitute an LC parallel resonance circuit (hereafter abbreviated as LC resonance circuit), while a resonance signal of the LC resonance circuit that is connected as a load to the collectors of the transistors $T_{IN1}$, $T_{IN2}$ is fed to the bases of the transistors $T_{IN1}$, $T_{IN2}$ in positive feedback, thereby carrying out oscillation operation.

In this oscillation circuit, LC resonance frequency is changed and the oscillation frequency is accordingly changed by varying the voltage $V_{TX}$ applied to the cathode terminals of the varactor diodes $C_{11}$, $C_{21}$ thereby varying the capacitances of the varactor diodes $C_{11}$, $C_{21}$.

In the oscillation circuit of the prior art described above, the inductance elements $L_1$, $L_2$ of the LC resonance circuit includes not only pure inductance component but also a series resistive component. In such an oscillation circuit, when the resonance frequency is changed in order to change the oscillation frequency, Q factor of oscillation also varies in concert therewith, thus resulting in such a problem that the oscillation output level changes and stable oscillation cannot be maintained.

Also because the varactor diodes $C_{11}$, $C_{21}$ are used as adjustable capacitance elements in the LC resonance circuit for the tuning of oscillation frequency, the tunable range of the oscillation frequency is determined by the adjustable range of capacitances of the varactor diodes $C_{11}$, $C_{21}$. Thus since the varactor diodes $C_{11}$, $C_{21}$ do not have large adjustable range of capacitances due to the characteristics thereof, it has been difficult to achieve oscillation over a large frequency range.

SUMMARY OF THE INVENTION

An object of the present invention is to provide an oscillation circuit that is capable of maintaining stable oscillation when the oscillation frequency is changed.

Another object of the present invention is to provide an oscillation circuit that is capable of making stable oscillation over a large range of frequencies.

An oscillation circuit of the first invention comprises a 3-terminal active element and an LC resonance circuit, the LC resonance circuit being connected with two terminals of the 3-terminal active element and output signal of the 3-terminal active element being fed back to the input terminal of the 3-terminal active element, wherein a voltage-current converter circuit that converts the voltage across the LC resonance circuit to a current and a current path for supplying the output current of the voltage-current converter circuit to the LC resonance circuit are provided. The voltage-current converter circuit and the current path function as Q-factor tuning voltage-current converter circuit that tunes the Q factor of the LC resonance circuit.

An oscillation circuit of the second invention comprises a pair of transistors that supply signals to bases or gates of a plurality of transistors of which emitters or sources are connected with each other and output a signal from the collector or the drain thereof, and a plurality of LC resonance circuits with one end each thereof being ac-grounded, wherein the other ends of the LC resonance circuits are connected to same type terminals of the transistors that constitute the transistor pair, and the signal from the collector or drain of each transistor of the transistor pair is fed back to the base or gate of the other transistor.

The oscillation circuit is characterized in that the voltage-current converter circuit that converts the voltage across the LC resonance circuit into a current and the current path for supplying the output current of the voltage-current converter circuit to the LC resonance circuit are provided. The voltage-current converter circuit and the current path function as Q-factor tuning voltage-current converter circuit that tunes the Q factor of the LC resonance circuit.

With these constitutions, when the oscillation frequency is changed by changing the resonance frequency of the LC resonance circuit, C/N characteristic deteriorates because the resistive component included in the LC resonance circuit causes the Q factor of the LC resonance circuit to change in concert therewith, although the change in the Q factor of the LC resonance circuit can be compensated for by means of the Q-factor tuning voltage-current converter circuit. As a result, it is made possible to stabilize the oscillation output level and the C/N characteristic when the oscillation frequency is changed.

The LC resonance circuit may be provided, for example, in the following two constitutions. An LC resonance circuit of the first constitution comprises an LC resonance main circuit consisting of an inductance element and a capacitance element, a current sensing resistor provided in series with the capacitance element and a frequency tuning voltage-current converter circuit that converts a voltage across the current sensing resistor into a current and outputs the current, wherein the resonance frequency is changed by feeding back the output current of the frequency tuning voltage-current converter circuit to the LC resonance main circuit.

An LC resonance circuit of the second constitution comprises of an inductance element and a capacitance element, wherein the capacitance element is constituted from a varactor diode and the oscillation frequency of the oscillation circuit is changed in accordance with a voltage applied from the outside to the varactor diode.

In the first constitution, since the resonance frequency of the LC resonance circuit is changed by means of the frequency tuning voltage-current converter circuit, tunable range of the resonance frequency is not limited, for example, within the adjustable range of the capacitance of the capacitance element, and the resonance frequency of the LC resonance circuit can be changed over a large range of frequencies. Thus it is made possible to oscillate over a large frequency range. Moreover, it is made possible to maintain oscillation with stable output power and C/N characteristic over a large frequency range, together with Q tuning by means of the Q-factor tuning voltage-current converter circuit.

In the second constitution, the resonance frequency can be changed with such a simple constitution that only adjusts the voltage applied to the varactor diode. Moreover, it is made possible to maintain oscillation with stable output power and C/N characteristic regardless of changes in the frequency, together with Q tuning by means of the Q-factor tuning voltage-current converter circuit.

An oscillation circuit of the third invention comprises a main portion of the oscillation circuit, second and third transistor pairs, second and third current sources, first and second resistors and connecting means.

The main portion of oscillation circuit comprises the first transistor pair, an LC resonance circuit and the first current source.

Emitters of the transistors of the first transistor pair are connected with each other, and the base of each transistor is connected to the collector of the other transistor. The LC resonance circuit is connected with the collectors of the transistors of the first transistor pair. The first current source is connected to the emitters of the transistors of the first transistor pair. The main portion of oscillation circuit outputs the oscillation signal from the collectors of the transistors of the first transistor pair.

Emitters of the transistors of the second transistor pair are connected with each other, and emitters of the transistors of the third transistor pair are connected with each other The second current source is connected to the emitters of the transistors of the second transistor pair, and the third current source is connected to the emitters of the transistors of the third transistor pair.

The first resistor is connected, on one terminal thereof, to the junction of the collector and the base of one of the transistors of the second transistor pair and the base of one of the transistors of the third transistor pair.

The second resistor is connected, on one terminal thereof, to the junction of the collector and the base of the other transistor of the second transistor pair and the base of the other transistor of the third transistor pair.

The connecting means connects the other terminals of the first and the second resistors and the collectors of the transistors of the first transistor pair, respectively.

This constitution makes it possible to change the Q factor of the oscillation signal of the main portion of oscillation circuit in accordance with the current ratio between the second and third current sources.

In the oscillation circuit having the constitution of the third invention, the LC resonance circuit is constituted from, for example, an inductance element and a varactor diode.

Capacitance of the varactor diode is changed by applying a voltage from the outside to the varactor diode, thereby changing the oscillation frequency of the oscillation circuit that includes the capacitance as a constituent element.

An oscillation circuit of the fourth invention comprises a main portion of oscillation circuit, a resistor, the second pair of transistors and the second current source.

The main portion of oscillation circuit comprises the first pair of transistors, the LC resonance circuit and the first current source.

Emitters of the transistors of the first transistor pair are connected with each other, and the base of each transistor is connected with the collector of the other transistor. The LC resonance circuit is connected with the collectors of the transistors of the first transistor pair. The first current source is connected to the emitters of the transistors of the first transistor pair. The main portion of oscillation circuit outputs an oscillation signal at the collectors of the transistors of the first transistor pair.

The resistor senses the current flowing in the element that constitutes the LC resonance circuit.

Emitters of the transistors of the second transistor pair are connected with each other, and bases of the transistors are connected to the respective terminals of the resistor, while the collectors of the transistors are connected to the collectors of the transistors of the first transistor pair.

The second current source is connected to the emitters of the transistors of the second transistor pair.

This constitution makes it possible to differentiate the oscillation frequency of the main portion of oscillation circuit in accordance with the current ratio between the first and second current sources.

Now the capability to differentiate the oscillation frequency will be described below. Magnitude of current flowing in the capacitance element can be sensed by connecting the resistor in series with the capacitance element that constitutes the LC resonance circuit. The current that is sensed is amplified by the second transistor pair and is fed to the collector of the first transistor in current feedback, so that the value of capacitance element that constitutes the LC resonance circuit is equivalently differentiated, thereby making it possible to differentiate the oscillation frequency.

An oscillation circuit of the fifth invention comprises an LC resonance circuit having a capacitance element and an inductance element and a 3-terminal active element, while the LC resonance circuit is connected with two terminals of the 3-terminal active element and output signal of the 3-terminal active element is fedback to the input terminal of the 3-terminal active element, wherein a voltage-current converter circuit that converts the voltage across the LC resonance circuit to a current, a first current path for supplying the output current of the voltage-current converter circuit to the LC resonance circuit, an amplifier circuit that senses the current flowing in the capacitance element or the inductance element and outputs an amplified current and a second current path for supplying the output current of the amplifier circuit to the LC resonance circuit are provided.

This constitution makes it possible to differentiate the Q factor by converting the voltage across the LC resonance circuit into a current and supplying the current via the first current path to the LC resonance circuit.

The oscillation frequency can also be differentiated by sensing the current flowing in the capacitance element or the inductance element and supplying the amplified current via the second current path to the LC resonance circuit.

The constitution of the fifth invention described above may also be modified so that the voltage-current converter circuit and the amplifier circuit differentiate the voltage-current conversion ratio and the amplification gain, respectively, in accordance with signals that are individually supplied thereto. Q factor can be differentiated by changing the voltage-current conversion ratio of the voltage-current converter circuit, and the oscillation frequency can be changed by changing the amplification gain of the amplifier circuit. Consequently, the oscillation frequency and the Q factor can be differentiated in accordance with signals supplied from the outside. The voltage-current conversion ratio of the voltage-current converter circuit and the amplification gain of the amplifier circuit may also be differentiated in accordance with each other. Such an operation scheme makes it possible to maintain the oscillation output substantially constant even when the oscillation frequency changes.

An oscillation circuit of the sixth invention comprises the main portion of oscillation circuit, the second and third transistor pairs, the second and third current sources, the first and second resistors, the connection means, a third resistor, a fourth transistor pair and a fourth current source.

The main portion of oscillation circuit comprises the first transistor pair, the LC resonance circuit and the first current source.

Emitters of the transistors of the first transistor pair are connected with each other, and the base of each transistor is connected to the collector of the other transistor. The LC resonance circuit is connected with the collectors of the transistors of the first transistor pair. The first current source is connected to the emitters of the transistors of the first transistor pair. The main portion of oscillation circuit outputs the oscillation signal at the collectors of the transistors of the first transistor pair.

Emitters of the transistors of the second transistor pair are connected with each other, and emitters of the transistors of the third transistor pair are connected with each other The second current source is connected to the emitters of the transistors of the second transistor pair, and the third current source is connected to the emitters of the transistors of the third transistor pair.

The first resistor is connected, on one terminal thereof, to the junction of the collector and the base of one of the transistors of the second transistor pair and the base of one of the transistors of the third transistor pair.

The second resistor is connected, on one terminal thereof, to the junction of the collector and the base of the other transistors of the second transistor pair and the base of the other transistor of the third transistor pair.

The connecting means connects the other terminals of the first and the second resistors and the collectors of the transistors of the first transistor pair, respectively.

The third resistor senses the current flowing in the element that constitutes the LC resonance circuit.

Emitters of the transistors of the fourth transistor pair are connected with each other, and bases of the transistors are connected to terminal of the third resistor, while the collectors of the transistors are connected to the collectors of the transistors of the first transistor pair.

The fourth current source is connected to the emitters of the transistors of the fourth transistor pair.

This constitution makes it possible to differentiate the oscillation frequency of the main portion of oscillation circuit in accordance with the current ratio between the first and fourth current sources. Q factor can also be differentiated in accordance with the current ratio between the second and third current sources.

In the oscillation circuit of the sixth invention, such a constitution may also be employed as the value of current of the fourth current source is differentiated in accordance with a signal supplied from the outside, and the value of current of at least one of the second and third current sources is differentiated in accordance with a signal supplied from the outside Such a constitution makes it possible to differentiate the current from the fourth current source in accordance with the signal supplied from the outside, thereby differentiating the frequency. Particularly in case such a PLL circuit is made as a signal of a predetermined frequency is output by comparing the phases of a signal of a reference signal source that provides output of a stable oscillation frequency and a signal of this oscillator, Q factor can be differentiated thus making it possible to maintain the oscillation output power and the C/N characteristic substantially constant, by supplying a signal that carries phase error information received from the PLL circuit to the fourth current source thereby differentiating the oscillation frequency and differentiating the currents supplied from the second and third current sources respectively.

BRIEF DESCRIPTION OF THE DRAWINGS

FIG. 8 is a circuit diagram explanatory of the operation principle of the oscillation circuit of the present invention.

DETAILED DESCRIPTION OF THE PREFERRED EMBODIMENTS

Embodiment 1

Figure 1:
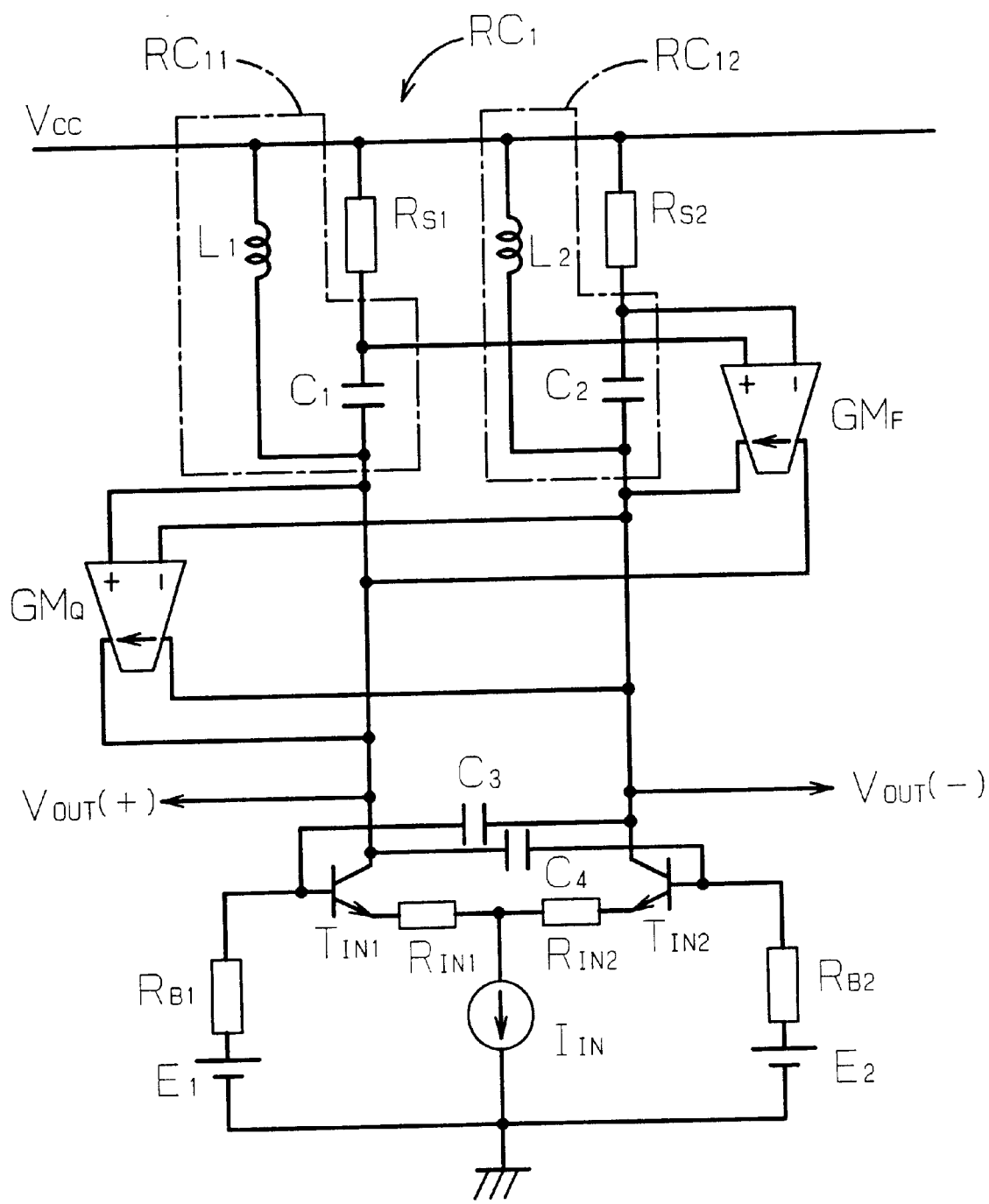
FIG. 1 is a block diagram showing the constitution of an oscillation circuit of the first embodiment of the present invention.

FIG. 1 is a block diagram of an oscillation circuit of differential operation according to the first embodiment of the present invention. This oscillation circuit has such a constitution as one terminal of an LC resonance main circuit $RC_{11}$ consisting of an inductance element $L_1$ (including a series resistive component $R_{11}$ not shown) and a capacitance element $C_1$ is connected to a power terminal to which a power voltage $V_{CC}$ is applied, and one terminal of am LC resonance main circuit $RC_{12}$ consisting of an inductance element $L_2$ (including a series resistive component $R_{12}$ not shown) and a capacitance element $C_2$ is connected thereto.

Other terminal of the LC resonance main circuit $RC_{11}$ is connected to the collector (output terminal of 3-terminal active element) of a transistor $T_{IN1}$ that is the 3-terminal active element. Other terminal of the LC resonance main circuit $RC_{12}$ is connected to the collector (output terminal of 3-terminal active element) of a transistor $T_{IN2}$ that is the 3-terminal active element.

A current sensing resistor $R_{S1}$ that senses the current flowing in the capacitance element $C_1$ is provided in series with the capacitance element $C_1$. A voltage having an amplitude that is proportional to the current flowing in the capacitance element $C_1$ appears across the current sensing resistor $R_{S1}$.

Similarly, a current sensing resistor $R_{S2}$ that senses the current flowing in the capacitance element $C_2$ is provided in series with the capacitance element $C_2$. A voltage having an amplitude that is proportional to the current flowing in the capacitance element $C_2$ appears across the current sensing resistor $R_{S2}$.

A frequency tuning voltage-current converter circuit $GM_F$ that senses the voltages across the current sensing resistors $R_{S1}$, $R_{S2}$ and feed back currents which correspond to the sensed voltages to the LC resonance main circuits $RC_{11}$, $RC_{12}$ is provided. The frequency tuning voltage-current converter circuit $GM_F$ has such a function that amplifies the current flowing in the capacitance element $C_1$, $C_2$ and supplies the amplified current to the LC resonance main circuits $RC_{11}$, $RC_{12}$. Such a constitution may also be conceived as the currents flowing in the inductance elements $L_1$, $L_2$ are amplified.

An LC resonance circuit $RC_1$ is constituted from the LC resonance main circuit $RC_{11}$, $RC_{12}$, the current sensing resistors $R_{S1}$, $R_{S2}$ and the frequency tuning voltage-current converter circuit $GM_F$ described above.

The frequency tuning voltage-current converter circuit $GM_F$ has such a specific constitution as a non-inverting voltage input terminal is connected to the junction of the capacitance element $C_1$ and the current sensing resistor $R_{S1}$, an inverting voltage input terminal is connected to the junction of the capacitance element $C_2$ and the current sensing resistor $R_{S2}$, one of the current output terminals is connected to the other terminal of the LC resonance main circuit $RC_{11}$, and the other current output terminal is connected to the other terminal of the LC resonance main circuit $RC_{12}$.

Voltage between the junction of the capacitance element $C_1$ and the current sensing resistor $R_{S1}$, and the junction of the capacitance element $C_2$ and the current sensing resistor $R_{S2}$ is converted into a current, which is fed back to between the other terminal of the LC resonance main circuit $RC_{11}$ and the other terminal of the LC resonance main circuit $RC_{12}$, thereby changing the resonance frequency of the LC resonance main circuit $RC_1$.

One terminal of a resistor $R_{IN1}$ is connected to the emitter of the transistor $T_{IN1}$, one terminal of a resistor $R_{IN2}$ is connected to the emitter of the transistor $T_{IN2}$, while the other terminals of the resistors $R_{IN1}$, $R_{IN2}$ are connected with each other and grounded via the current source $I_{IN}$.

Base (input terminal of the 3-terminal active element) of the transistor $T_{IN1}$ is grounded via a resistor $R_{B1}$ and a voltage source $E_1$ and is connected to the collector of the transistor $T_{IN2}$ via the capacitor $C_3$, while base (input terminal of the 3-terminal active element) of the transistor $T_{IN2}$ is grounded via a resistor $R_{B2}$ and a voltage source $E_2$ and is connected to the collector of the transistor $T_{IN1}$ via the capacitor $C_4$. With this configuration, oscillation signal provided at the output of the LC resonance circuit $RC_1$ is fed back to the input terminal of the 3-terminal active element, namely the bases of the transistors $T_{IN1}$, $T_{IN2}$, thus achieving the oscillation operation. In this case, oscillation frequency changes as the resonance frequency of the LC resonance circuit $RC_1$ changes.

In case the base of the transistor $T_{IN1}$ is directly connected to the collector of the transistor $T_{IN2}$, and the base of the transistor $T_{IN2}$ is connected directly to the collector of the transistor $T_{IN1}$, without the capacitors $C_3$, $C_4$ intervening, the resistor $R_{B1}$, the voltage source $E_1$, the resistor $R_{B2}$ and the voltage source $E_2$ become unnecessary.

Thus one of oscillation outputs $V_{OUT}(+)$ is obtained at the collector of the transistor $T_{IN1}$ and the other oscillation output $V_{OUT}(-)$ is obtained at the collector of the transistor $T_{IN2}$. The emitter follower circuit shown in the prior art example is omitted in FIG. 1.

When it is needed to reverse the sense of change in frequency, such a constitution may be employed as the non-inverting voltage input terminal of the frequency tuning voltage-current converter circuit $GM_F$ is connected to the junction of the capacitance element $C_2$ and the current sensing resistor $R_{S2}$ and the inverting voltage input terminal is connected to the junction of the capacitance element $C_1$ and the current sensing resistor $R_{S1}$. When it is desired to change the frequency in two ways, the two types of frequency tuning voltage-current converter circuit $GM_F$ described above, that have the non-inverting voltage input terminal and the inverting voltage input terminal connected in opposite configurations, may be used together.

This oscillation circuit also has the Q-factor tuning voltage-current converter circuit $GM_Q$ that changes the Q factor of the LC resonance circuit $RC_1$ by sensing the voltage appearing across the LC resonance circuit $RC_1$ and feeding back a current, that corresponds to the voltage sensed, to the LC resonance circuit $RC_1$.

The Q-factor tuning voltage-current converter circuit $GM_Q$ has such a configuration as the non-inverting voltage input terminal thereof is connected to the other terminal of the LC resonance main circuit $RC_{11}$, the inverting voltage input terminal is connected to the other terminal of the LC resonance main circuit $RC_{12}$, one of the current output terminals is connected to the other terminal of the LC resonance main circuit $RC_{11}$, and the other current output terminal is connected to the other terminal of the LC resonance main circuit $RC_{12}$.

This configuration; the voltage given at a point between the other terminal of the LC resonance main circuit $RC_{11}$ and the other terminal of the LC resonance main circuit $RC_{12}$ is converted into a current which is fed back to the point between the other terminal of the LC resonance main circuit $RC_{11}$ and the other terminal of the LC resonance main circuit $RC_{12}$, thereby changes or differentiates the Q factor of the LC resonance circuit $RC_1$. This makes it possible to adjust the oscillation output level of the oscillation circuit so that, for example, the oscillation output level can be maintained constant regardless of changes in the oscillation frequency.

The principles of the operation to change the resonance frequency of the LC resonance circuit by means of the frequency tuning voltage-current converter circuit $GM_F$; and of the operation to change or differentiate the Q factor of the LC resonance circuit by means of the Q-factor tuning voltage-current converter circuit $GM_2$, will now be described below with reference to FIG. 8.

FIG. 8(a) shows the LC resonance circuit comprising an inductance element L and a capacitance element C. $R_L$ represents a series resistor that is included in the inductance element L.

Resonance frequency $\omega_{CO}$ and Q factor $Q_0$ of the LC resonance circuit shown in FIG. 8(a) are generally given by the following equations.

$$\omega_{CO}=1/(LC)^{1/2} \qquad (1)$$

$$Q_0=\omega_{CO}L/R_L=(1/R_L)(L/C)^{1/2} \qquad (2)$$

FIG. 8(b) shows an LC resonance circuit that has a parallel conductance G provided therein instead of the series resistor $R_L$ of FIG. 8(a). Assuming that the LC resonance circuit of FIG. 8(a) and the LC resonance circuit of FIG. 8(b) are equivalent to each other, then the conductance G is represented as follows.

$$G=1/(Q_0^2+1)R_L \qquad (3)$$

where $R_L^2 \ll (\omega_{CO}L)^2$.

In the LC resonance circuit that is modified into the equivalent circuit shown in FIG. 8(b), a conductance $-G_Q$ is connected in parallel to the LC resonance circuit in order to cancel out the conductance G as shown in FIG. 8(c).

With the conductance $-G_Q$ being used as described above, resonance frequency $\omega_C$ and Q factor of the LC resonance circuit can be represented as follows.

$$\omega_C=\omega_{CO}(1-G_QR_L)^{1/2} \qquad (4)$$

$$Q = Q_o(1-G_QR_L)^{1/2}/(1-Q_o^2 G_QR_L) \qquad (5)$$

$$\approx Q_o/\{1-G_QL/(R_LC)\}$$

As will be understood from the equations (4) and (5), resonance frequency $\omega_C$ and Q factor can be changed by the use of the conductance $-G_Q$.

FIG. 8(d) shows an impedance conversion circuit that employs a current source. In this circuit, a current source $A_II_Z$ that supplies a current having a value $A_I$ times the current $I_Z$ to flow through an impedance $Z_0$ where the current $I_Z$ flows. This circuit can be regarded as equivalent to the impedance Z shown in FIG. 8(e), while the impedance Z is given as follows.

$$Z=Z_0/(A_I+1) \qquad (6)$$

This means that, when a current source capable of changing the current is connected in parallel to an impedance, value of the impedance can be virtually changed by changing the current.

In the first embodiment described above, in order to change the resonance frequency of the LC resonance circuit, currents flowing in the capacitance elements $C_1$, $C_2$ of the LC resonance circuit $RC_1$ are converted into voltages by the current sensing resistors $R_{S1}$, $R_{S2}$, the voltage signal is converted into current in the frequency tuning voltage-current converter circuit $GM_F$ and is fed back to the LC resonance circuit $RC_1$, namely the oscillation output. This operation is based on the concept of impedance conversion described in conjunction with FIG. 8(d), (e), and the resonance frequency is changed by changing the impedance of the LC resonance circuit.

When two frequency tuning voltage-current converter circuits that take voltages across the current sensing resistors $R_{S1}$, $R_{S2}$ with opposite polarities are provided, the resonance frequency can be changed in both ways, to increase and decrease, from the intrinsic resonance frequency $\omega_{CO}$ of the inductance element $L_1$ and the capacitance element $C_1$. The resonance frequency is determined by the difference in conductance provided by the frequency tuning voltage-current converter circuits.

Also in the first embodiment described above, Q factor of the band-pass characteristic is changed by changing the input impedance of the circuit consisting of the resistors $R_{L1}$, $R_{L2}$ that are connected in series with the inductance elements $L_1$, $L_2$. This is based on the concept described with FIG. 8(a) through (c). When in FIG. 8(c) the conductance $-G_Q$ is set so as to make $-G_Q$ equals (=) G, for example, Q factor of the LC resonance circuit becomes theoretically infinite.

As described above, when the LC resonance circuit that is capable of changing the resonance frequency and Q factor is used as the oscillation circuit, the oscillation frequency can be adjusted without using a varactor diode, and it is made possible to achieve stable oscillation over a large tunable frequency range by changing the Q factor at the same time.

The resonance frequency $\omega_C$ and Q factor of the oscillation circuit shown in FIG. 1 are given as follows.

$$\omega_C=\omega_{CO} \cdot (1-gm_QR_L)^{1/2}/\{1+(gm_F-gm_Q)R_S\}^{1/2} \qquad (7)$$

$$Q = Q_o(1-gm_QR_L)^{1/2} \cdot \{1+(gm_F-gm_Q)R_S\}^{1/2} / \qquad (8)$$
$$\{1-gm_Q(L/CR_L+R_S)+R_S/R_L+gm_FR_S\}$$

where $R_S=R_{S1}=R_{S2}$
$R_L=R_{L1}=R_{L2}$
$L=L_1=L_2$
$C=C_1=C_2$

The term $gm_Q$ represents the conductance of the Q-factor tuning voltage-current converter circuit and $gm_F$ represents the conductance of the frequency tuning voltage-current converter circuit.

When conditions $gm_Q R_L \ll 1$, and $gm_Q R_S \ll 1 + gm_F R_S$ are satisfied, then the resonance frequency $\omega_C$ can be approximated as follows.

$$\omega_C = \omega_{CO}/(1+gm_F R_S)^{1/2} \tag{9}$$

Figure 2:
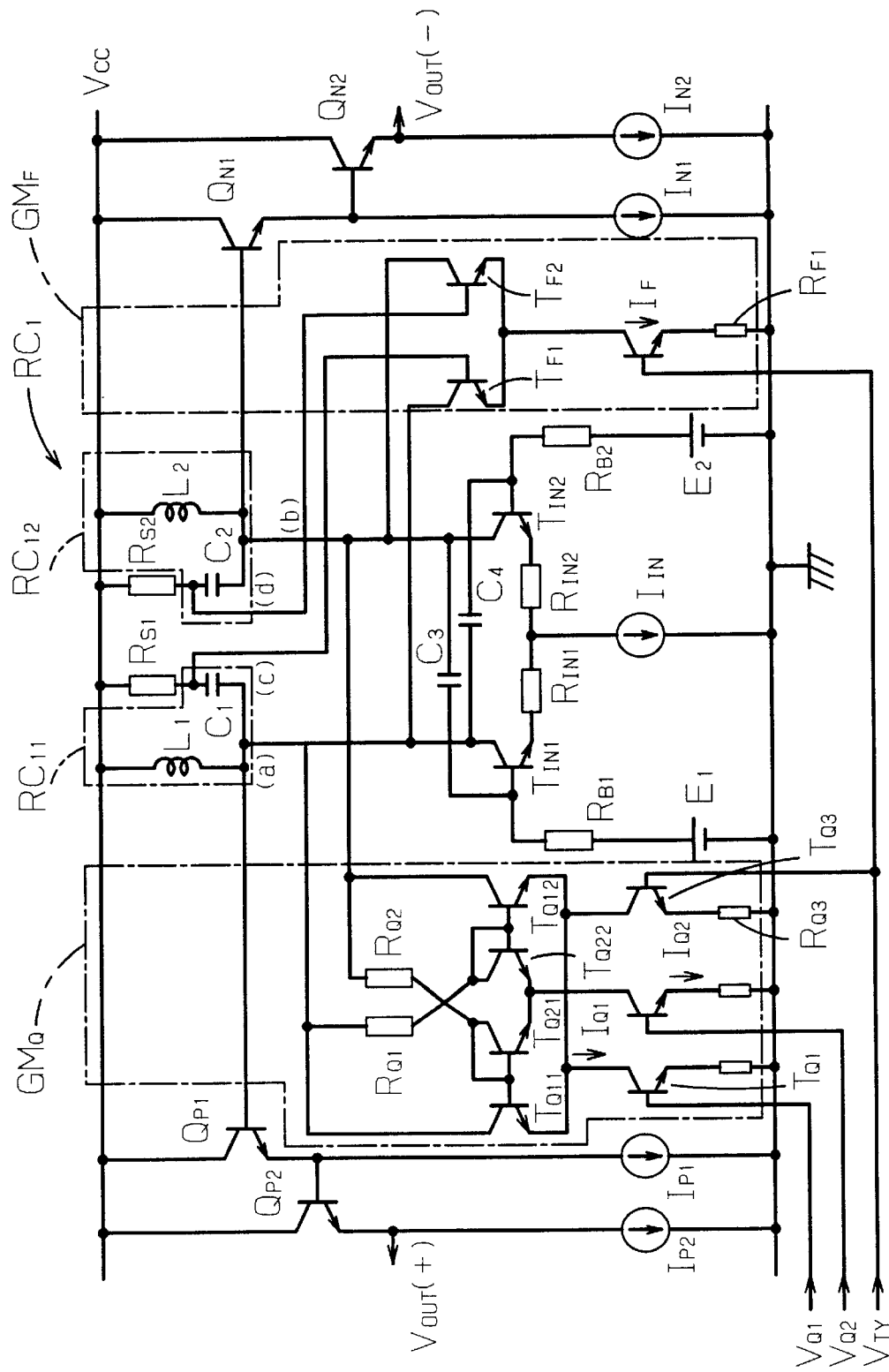
FIG. 2 is a block diagram showing the specific constitution of an oscillation circuit of the first embodiment of the present invention.

A circuit diagram showing the oscillation circuit of FIG. 1 embodied at the transistor level is shown in FIG. 2. This oscillation circuit has, as shown in FIG. 2, an emitter follower circuit comprising transistors $Q_{P1}$, $Q_{P2}$, $Q_{N1}$, $Q_{N2}$ and current sources $I_{P1}$, $I_{P2}$, $I_{N1}$, $I_{N2}$ which are similar to those of the prior art being added thereto.

The frequency tuning voltage-current converter circuit $GM_F$ comprises transistors $T_{F1}$, $T_{F2}$ and a current source $I_F$. The transistor $T_{F1}$ is used in such a configuration as the base thereof, that functions as the non-inverting voltage input terminal is connected to the junction of the capacitance element $C_1$ and the current sensing resistor $R_{S1}$, namely point (c), while the collector that functions as one current output terminal is connected to point (a) and the emitter is connected to one terminal of the current source $I_F$. The transistor $T_{F2}$ is used in such a configuration as the base thereof, that functions as the inverting voltage input terminal is connected to the junction of the capacitance element $C_2$ and the current sensing resistor $R_{S2}$, namely point (d), while the collector that functions as the other current output terminal is connected to point (b) and the emitter is connected to one terminal of the current source $I_F$. The other terminal of the current source $I_F$ is grounded.

The current source $I_F$ can be constituted from, for example, transistor and an emitter resistor. The current can be adjusted in accordance with a voltage $V_{TY}$ that is input to the base of the transistor. For the voltage $V_{TY}$ described above, for example, a control signal that carries phase error information provided from a phase-locked loop (PLL) circuit may be used.

The conductance $gm_F$ of the frequency tuning voltage-current converter circuit $GM_F$ is given as follows.

$$gm_F = I_F/4V_T \tag{10}$$

where $I_F$ is the current flowing in the current source $I_F$. $V_T$ is the barrier voltage existing between the base and the emitter of the transistor given as follows, which is approximately 26 mV at the room temperature, where k is the Boltzmann constant, T is absolute temperature and q is the charge of one electron. $V_T = kT/q$ The frequency tuning voltage-current converter circuit $GM_F$ described above is capable of tuning the oscillation frequency by changing the ratio of current $I_{IN}$ and current $I_F$.

The Q-factor tuning voltage-current converter circuit $GM_Q$ comprises transistors $T_{Q11}$, $T_{Q12}$, $T_{Q21}$, $T_{Q22}$, resistors $R_{Q1}$, $R_{Q2}$, and current sources $I_{Q1}$, $I_{Q2}$. The collector of the transistor $T_{Q11}$ is connected to point (a), the collector of the transistor $T_{Q12}$ is connected to point (b), the collector of the transistor $T_{Q22}$ is connected to point (a) via the resistor $R_{Q1}$ and the collector of the transistor $T_{Q21}$ is connected to point (b) via the resistor $R_{Q2}$.

The base of the transistor $T_{Q11}$ is connected to the base and collector of the transistor $T_{Q21}$, and the base of the transistor $T_{Q12}$ is connected to the base and collector of the transistor $T_{Q22}$.

The emitter of the transistor $T_{Q11}$ and the emitter of the transistor $T_{Q12}$ are connected together to one terminal of the current source $I_{Q1}$, while the other terminal of the current source $I_{Q1}$ is grounded. The emitter of the transistor $T_{Q21}$ and the emitter of the transistor $T_{Q22}$ are connected together to one terminal of the current source $I_{Q2}$, while the other terminal of the current source $I_{Q2}$ is grounded.

The current sources $I_{Q1}$, $I_{Q2}$ can be constituted, for example, from transistor and an emitter resistor, so as to adjust the current in accordance with voltages $V_{Q1}$, $V_{Q2}$ that are input to the bases of the transistors. For the voltages $V_{Q1}$, $V_{Q2}$, described above, for example, a signal that carries frequency information may be used. Specifically, a signal that carries frequency setting signal or phase error information of a PLL circuit may be used.

Figure 5:
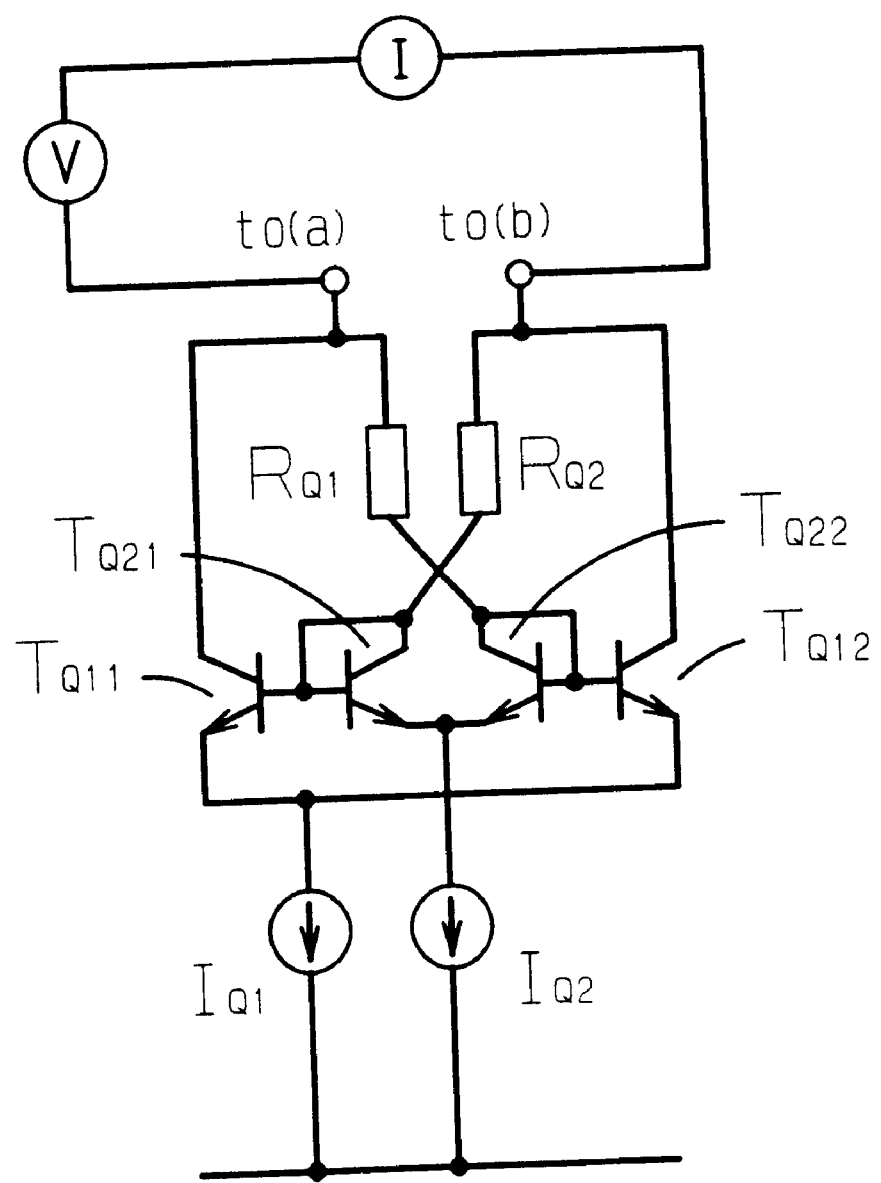
FIG. 5 is a circuit diagram explanatory of conductance of a Q-factor tuning voltage-current converter circuit.

Denoting the voltage applied between point (a) and point (b) as V and current that flows between point (a) and point (b) as I, as shown in FIG. 5, conductance $gm_Q$ of the Q-factor tuning voltage-current converter circuit $GM_Q$ is given as $gm_Q = I/V$ and can be represented as follows.

$$gm_Q = (gm_{Q1} - gm_{Q2})/(1 + gm_{Q2}R_Q) \tag{11}$$

$$gm_{Q1} = I_{Q1}/4V_T$$

$$gm_{Q2} = I_{Q2}/4V_T$$

where
$V_T$ is the barrier voltage appearing between the base and the emitter of the transistor. $I_{Q1}$, $I_{Q2}$ are currents flowing in the current sources $I_{Q1}$, $I_{Q2}$, and the voltage-current conversion ratio (conductance) can be changed by changing the ratio of the currents flowing in the current sources $I_{Q1}$, $I_{Q2}$.

In the oscillation circuit of this embodiment, as described above, when the oscillation frequency is changed by changing the resonance frequency of the LC resonance circuit $RC_1$, the resistive component included in the LC resonance circuit $RC_1$ causes the Q factor of the LC resonance circuit $RC_1$ to change in concert therewith, while the change in the Q factor of the LC resonance circuit $RC_1$, can be compensated for by means of the Q-factor tuning voltage-current converter circuit $GM_Q$. As a result, it is made possible to stabilize the oscillation output level and the C/N characteristic when the oscillation frequency is changed.

Also since the resonance frequency of the LC resonance circuit $RC_1$ is changed by means of the frequency tuning voltage-current converter circuit $GM_F$, tunable range of the oscillation frequency is not limited within the adjustable range of the capacitance of the capacitance element, and the resonance frequency of the LC resonance circuit $RC_1$ can be changed over a large range of frequencies. Thus it is made possible to oscillate over a large frequency range. Moreover, it is made possible to maintain oscillation with a stable output power over a large frequency range, together with Q tuning by means of the Q-factor tuning voltage-current converter circuit $GM_Q$.

Embodiment 2

Figure 3:
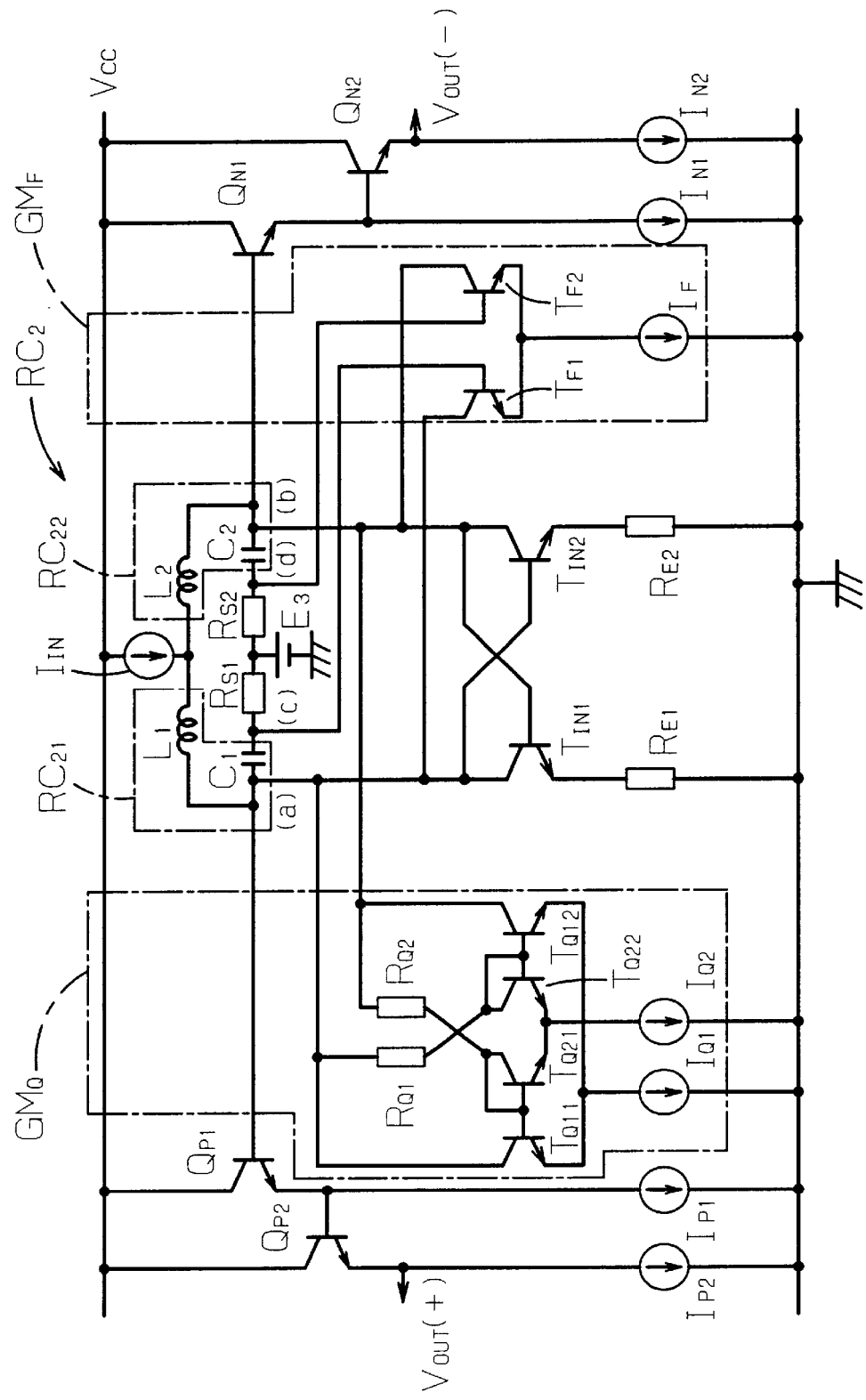
FIG. 3 is a block diagram showing the specific constitution of an oscillation circuit of the second embodiment of the present invention.

FIG. 3 is a block diagram of an oscillation circuit of differential configuration according to the second embodiment of the present invention. This embodiment is different from the first embodiment in the constitution of the LC resonance circuit, and is accordingly different in the connection of the LC resonance circuit and the 3-terminal active element, too. In other respects, the second embodiment is similar to the first embodiment.

Specifically, as shown in FIG. 3, one terminal of the current source $I_{IN}$ is connected to a power terminal to which power voltage $V_{CC}$ is applied, while one terminal each of the inductance element $L_1$ (including a series resistive component $R_{L1}$ not shown) and the inductance element $L_2$ (including a series resistive component $R_{L2}$ not shown) is connected to the other terminal of the current source $I_{IN}$. One terminal of the capacitance element $C_1$ is connected to the other terminal of the inductance element $L_1$, and one terminal of the current sensing resistor $R_{S1}$ is connected to the other terminal of the capacitance element $C_1$. One terminal of the capacitance element $C_2$ is connected to the other terminal of the inductance element $L_2$, and one terminal of the current sensing resistor $R_{S2}$ is connected to the other terminal of the capacitance element $C_2$. The other terminals of the current sensing resistors $R_{S1}$, $R_{S2}$ are connected with each other, and grounded via a voltage source $E_3$.

The inductance element $L_1$ and the capacitance element $C_1$ constitute the LC resonance main circuit $RC_{21}$, while the inductance element $L_2$ and the capacitance element $C_2$ constitute the LC resonance main circuit $RC_{22}$.

The current sensing resistors $R_{S1}$, $R_{S2}$ are provided to sense the currents flowing in the capacitance elements $C_1$, $C_2$, while voltages proportional to the currents flowing in the capacitance element $C_1$, $C_2$, respectively, appear across the current sensing resistors $R_{S1}$, $R_{S2}$.

Junction of the inductance element $L_1$ and the capacitance element $C_1$ is connected to the collector (output terminal of the 3-terminal active element) of the transistor $T_{IN1}$ that is the 3-terminal active element. Junction of the inductance element $L_2$ and the capacitance element $C_2$ is connected to the collector (output terminal of the 3-terminal active element) of the transistor $T_{IN2}$ that is the 3-terminal active element.

The frequency tuning voltage-current converter circuit $GM_F$ is provided to sense the voltages across the current sensing resistors $R_{S1}$, $R_{S2}$ and feed back currents that correspond to the voltages sensed to the LC resonance main circuits $RC_{21}$, $RC_{22}$. Specific constitution of the frequency tuning voltage-current converter circuit $GM_F$ is similar to that of the first embodiment.

The LC resonance main circuits $RC_{21}$, $RC_{22}$, the current sensing resistors $R_{S1}$, $R_{S2}$ and the frequency tuning voltage-current converter circuit $GM_F$ described above constitute the LC resonance circuit $RC_2$.

The frequency tuning voltage-current converter circuit $GM_F$ has such a specific constitution as the base of the transistor $T_{F1}$ that is a non-inverting voltage input terminal is connected to the junction of the capacitance element $C_1$ and the current sensing resistor $R_{S1}$, the base of the transistor $T_{F2}$ that is an inverting voltage input terminal is connected to the junction of the capacitance element $C_2$ and the current sensing resistor $R_{S2}$, the collector of the transistor $T_{F1}$ that is one of the current output terminals is connected to the junction of the inductance element $L_1$ and the capacitance element $C_1$, and the collector of the transistor $T_{F2}$ that is the other current output terminals is connected to the junction of the inductance element $L_2$ and the capacitance element $C_2$.

Voltage given at point between the junction of the capacitance element $C_1$ and the current sensing resistor $R_{S1}$ and the junction of the capacitance element $C_2$ and the current sensing resistor $R_{S2}$ is converted into a current, which is fed back to the point between the junction of the inductance element $L_1$ and the capacitance element $C_1$ and the junction of the inductance element $L_2$ and the capacitance element $C_2$, thereby changing the resonance frequency of the LC resonance circuit $RC_2$.

One terminal of a resistor $R_{E1}$ is connected to the emitter of the transistor $T_{IN1}$, one terminal of a resistor $R_{E2}$ is connected to the emitter of the transistor $T_{IN2}$, while the other terminals of the resistors $R_{E1}$, $R_{E2}$ are grounded.

The base (input terminal of the 3-terminal active element) of the transistor $T_{IN1}$ is connected to the collector of the transistor $T_{IN2}$, while the base (input terminal of the 3-terminal active element) of the transistor $T_{IN2}$ is connected to the collector of the transistor $T_{IN1}$. With this configuration, resonance signal of the LC resonance circuit $RC_2$ is fed back to the input terminal of the 3-terminal active element, namely the bases of the transistors $T_{IN1}$, $T_{IN2}$, thus achieving oscillation. In this case, oscillation frequency changes as the resonance frequency of the LC resonance circuit $RC_2$ changes.

Junction of the inductance element $L_1$, the capacitance element $C_1$ and the transistor $T_{IN1}$ is connected to the base of the transistor $Q_{P1}$ that constitutes an emitter follower circuit. The collector of the transistor $Q_{P1}$ is connected to a power terminal, while the emitter thereof is grounded via the current source $I_{P1}$ and is, at the same time, connected to the base of the transistor $Q_{P2}$ that constitutes an emitter follower circuit. The collector of the transistor $Q_{P2}$ is connected to the power terminal, while the emitter is grounded via a current source $I_{P2}$, so that one of oscillation outputs $V_{OUT}$ (+) is obtained at the emitter of the transistor $Q_{P2}$.

Junction of the inductance element $L_2$, the capacitance element $C_2$ and the transistor $T_{IN2}$ is connected to the base of the transistor $Q_{N1}$ that constitutes an emitter follower circuit. The collector of the transistor $Q_{N1}$ is connected to a power terminal, while the emitter is grounded via the current source $I_{N1}$ and is, at the same time, connected to the base of a transistor $Q_{N2}$ that constitutes the emitter follower circuit. The collector of the transistor $Q_{N2}$ is connected to a power terminal, while the emitter is grounded via the current source $I_{N2}$, so that the other oscillation output $V_{OUT}$ (−) is obtained at the emitter of the transistor $Q_{N2}$.

In this embodiment, constitution of the LC resonance circuit $RC_2$ is different from that of the LC resonance circuit $RC_1$ of the first embodiment, and accordingly the frequency tuning voltage-current converter circuit $GM_F$ and the Q-factor tuning voltage-current converter circuit $GM_Q$ are connected differently, although the constitution is basically the same as that of the first embodiment and the same effects as those of the first embodiment are achieved.

Embodiment 3

Figure 4:
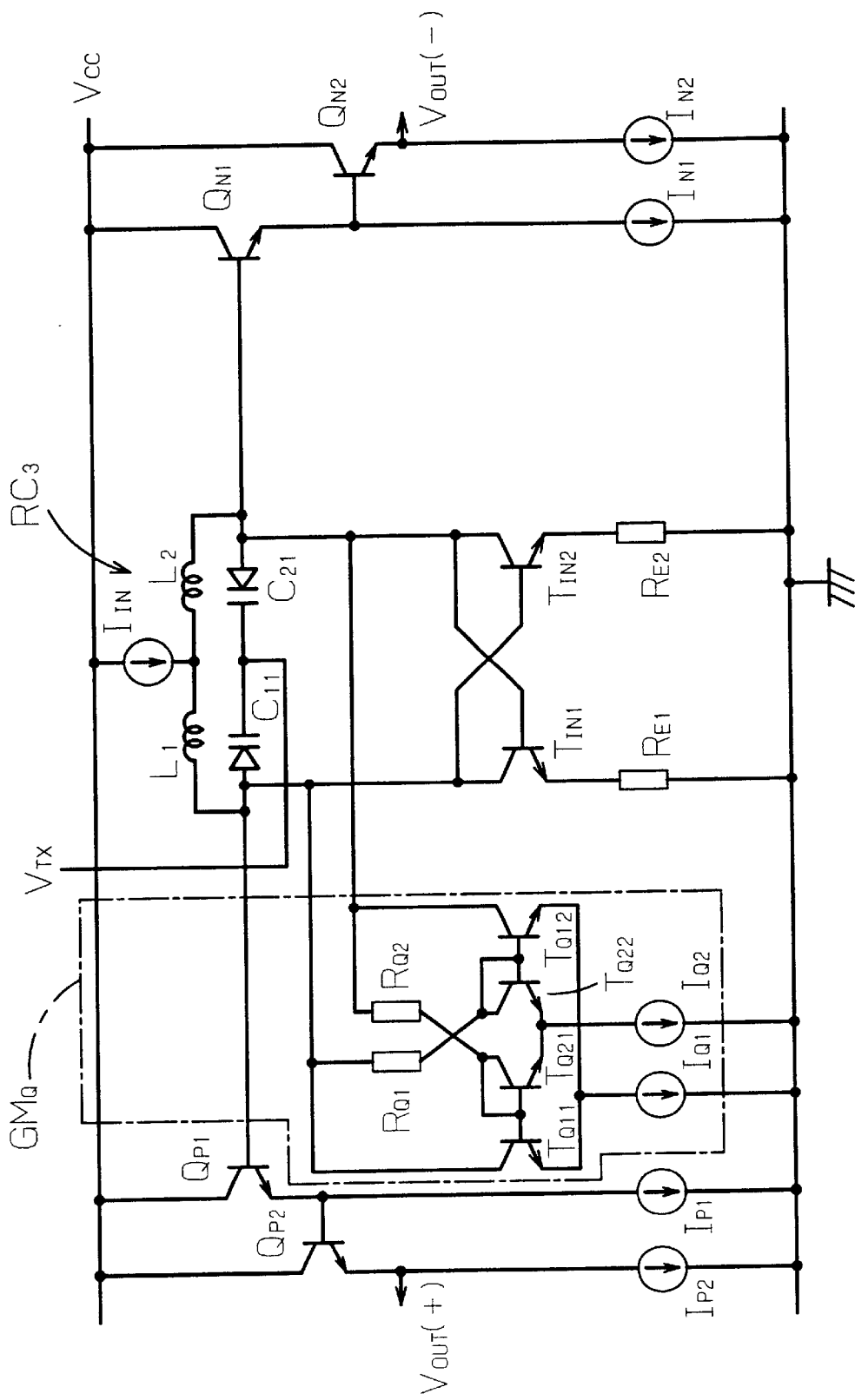
FIG. 4 is a block diagram showing the specific constitution of an oscillation circuit of the third embodiment of the present invention.

FIG. 4 is a block diagram of an oscillation circuit of differential constitution according to the third embodiment of the present invention. This embodiment has such a constitution as the Q-factor tuning voltage-current converter circuit $GM_Q$ is added to the constitution of the prior art, where the frequency is tuned by changing the voltage $V_{TX}$ applied to the varactor diodes $C_{11}$, $C_{21}$, while the Q factor is tuned similarly to the case of the first and second embodiments.

In the oscillation circuit of this embodiment, as described above, when the oscillation frequency is changed by changing the resonance frequency of the LC resonance circuit $RC_3$, the resistive component included in the LC resonance circuit $RC_3$ causes the Q factor of the LC resonance circuit $RC_3$ to change in concert therewith, while the change in the Q factor of the LC resonance circuit $RC_3$ can be compensated for by means of the Q-factor tuning voltage-current converter circuit $GM_Q$. As a result, it is made possible to stabilize the oscillation output level and the C/N characteristic when the oscillation frequency is changed.

Embodiment 4

Figure 6:
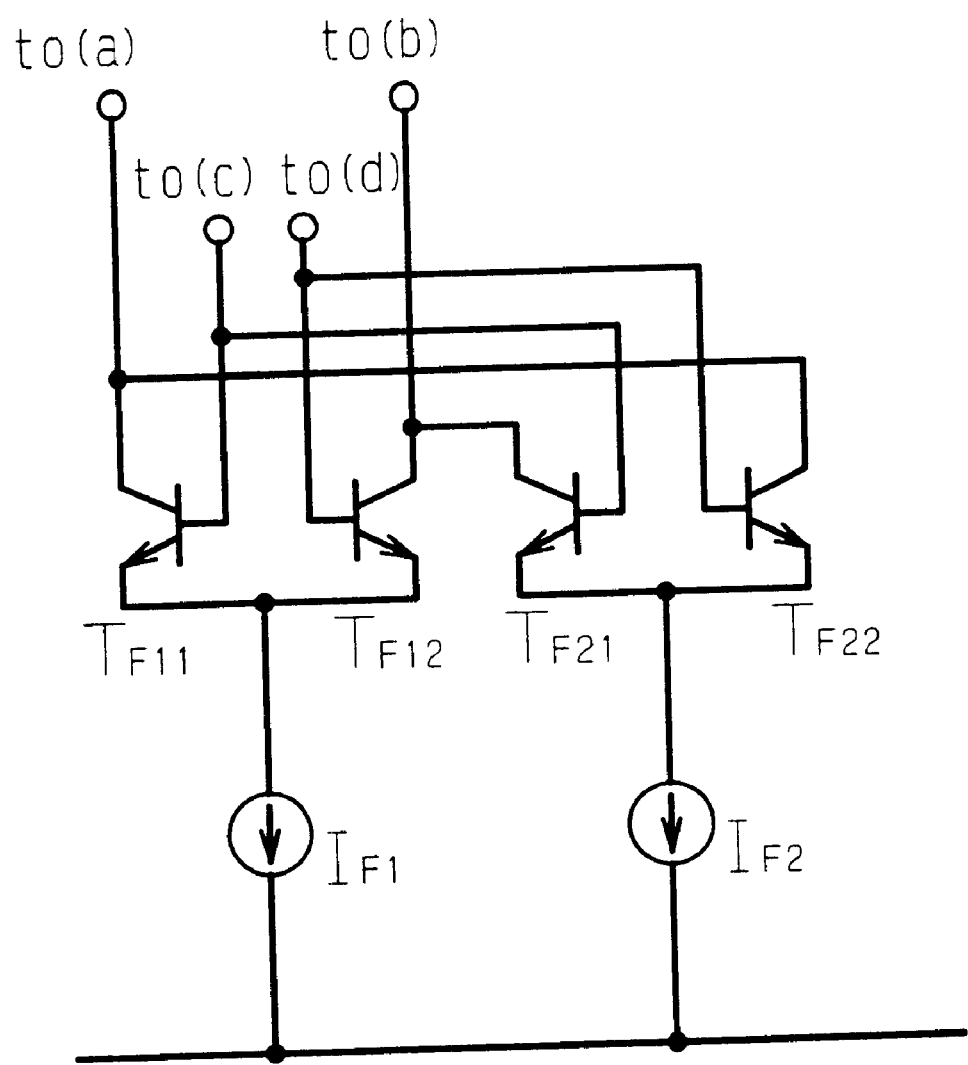
FIG. 6 is a block diagram showing the constitution of a frequency tuning voltage-current converter circuit of an oscillation circuit according to the fourth embodiment of the present invention.

FIG. 6 is a circuit diagram of a frequency tuning voltage-current converter circuit of an oscillation circuit according to the fourth embodiment of the present invention. This embodiment makes it possible to change the resonance frequency in both ways, to increase and decrease, from the intrinsic resonance frequency of the LC resonance circuit. Specifically, collectors of the transistors $T_{F11}$, $T_{F22}$ are connected to point (a) of the circuit shown in FIG. 2, collectors of the transistors $T_{F12}$, $T_{F21}$ are connected to point (b), bases of the transistors $T_{F11}$, $T_{F21}$ are connected to point (c), and bases of the transistors $T_{F12}$, $T_{F22}$ are connected to point (d). Emitters of the transistors $T_{F11}$, $T_{F12}$ are connected with each other and grounded via the current source $I_{F1}$, while emitters of the transistors $T_{F21}$, $T_{F22}$ are connected with each other and grounded via the current source $I_{F2}$.

This circuit is capable of changing the frequency in accordance with the current ratio of the current sources $I_{F1}$, $I_{F2}$.

In this embodiment, the resonance frequency of the LC resonance circuit can be changed in both ways, to increase and decrease, from the intrinsic resonance frequency of the LC resonance circuit consisting of the inductance elements $L_1$, $L_2$ and the capacitance elements $C_1$, $C_2$ thus making it possible to have a larger tunable range of frequency. Other effects can be achieved similarly to the case of the first embodiment.

The frequency tuning voltage-current converter circuit of this embodiment can also be applied to the circuit shown in FIG. 3.

Embodiment 5

Figure 7:
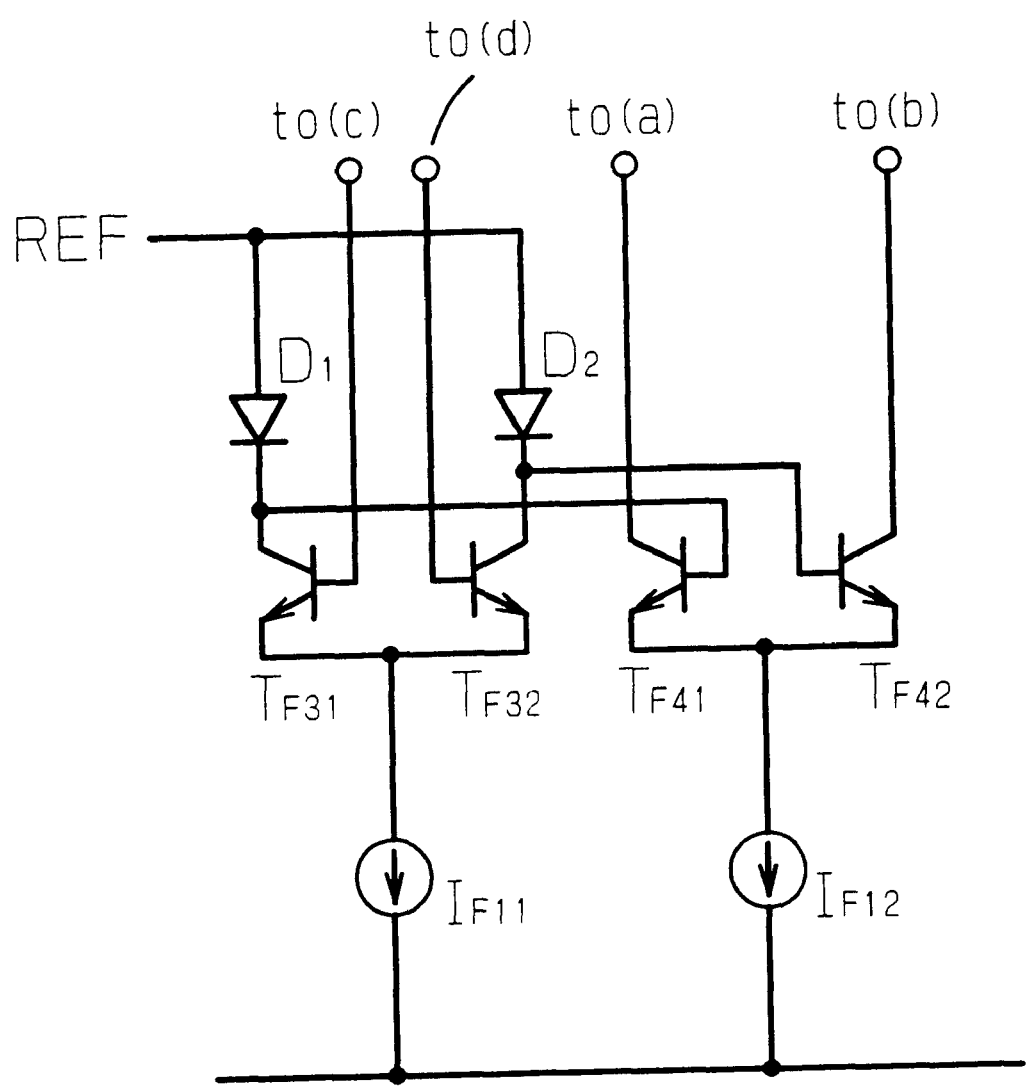
FIG. 7 is a block diagram showing the constitution of a frequency tuning voltage-current converter circuit of an oscillation circuit according to the fifth embodiment of the present invention.

FIG. 7 is a circuit diagram of a frequency tuning voltage-current converter circuit provided in an oscillation circuit according to the fifth embodiment of the present invention. In this embodiment, transistors are connected in two stages, making it possible to increase the adjustable range of the voltage-current conversion ratio (conductance). Specifically, collector of a transistor $T_{F31}$ is connected to a reference voltage REF via a diode $D_1$, and collector of a transistor $T_{F32}$ is connected to the reference voltage REF via a diode $D_2$. Emitters of the transistors $T_{F31}$, $T_{F32}$ are connected with each other, and grounded via a current source $I_{F11}$. Base of the transistor $T_{F31}$ is connected to point (c) of the circuit shown in FIG. 2, and base of the transistor $T_{F32}$ is connected to point (d) of the circuit shown in FIG. 2. The collector of the transistor $T_{F31}$ is connected to the base of a transistor $T_{F41}$, and the collector of the transistor $T_{F32}$ is connected to the base of a transistor $T_{F42}$. Emitters of the transistors $T_{F41}$, $T_{F42}$ are connected with each other and grounded via the current source $I_{F12}$. The collector of the transistor $T_{F41}$ is connected to point (a) of the circuit shown in FIG. 2, and the collector of the transistor $T_{F42}$ is connected to point (b).

The oscillation circuit of this embodiment makes it possible to increase the tunable range of frequency. Other effects are similar to those of the first embodiment.

The frequency tuning voltage-current converter circuit provided in the circuit of this embodiment may also be applied to the circuit shown in FIG. 3.

Figure 9:
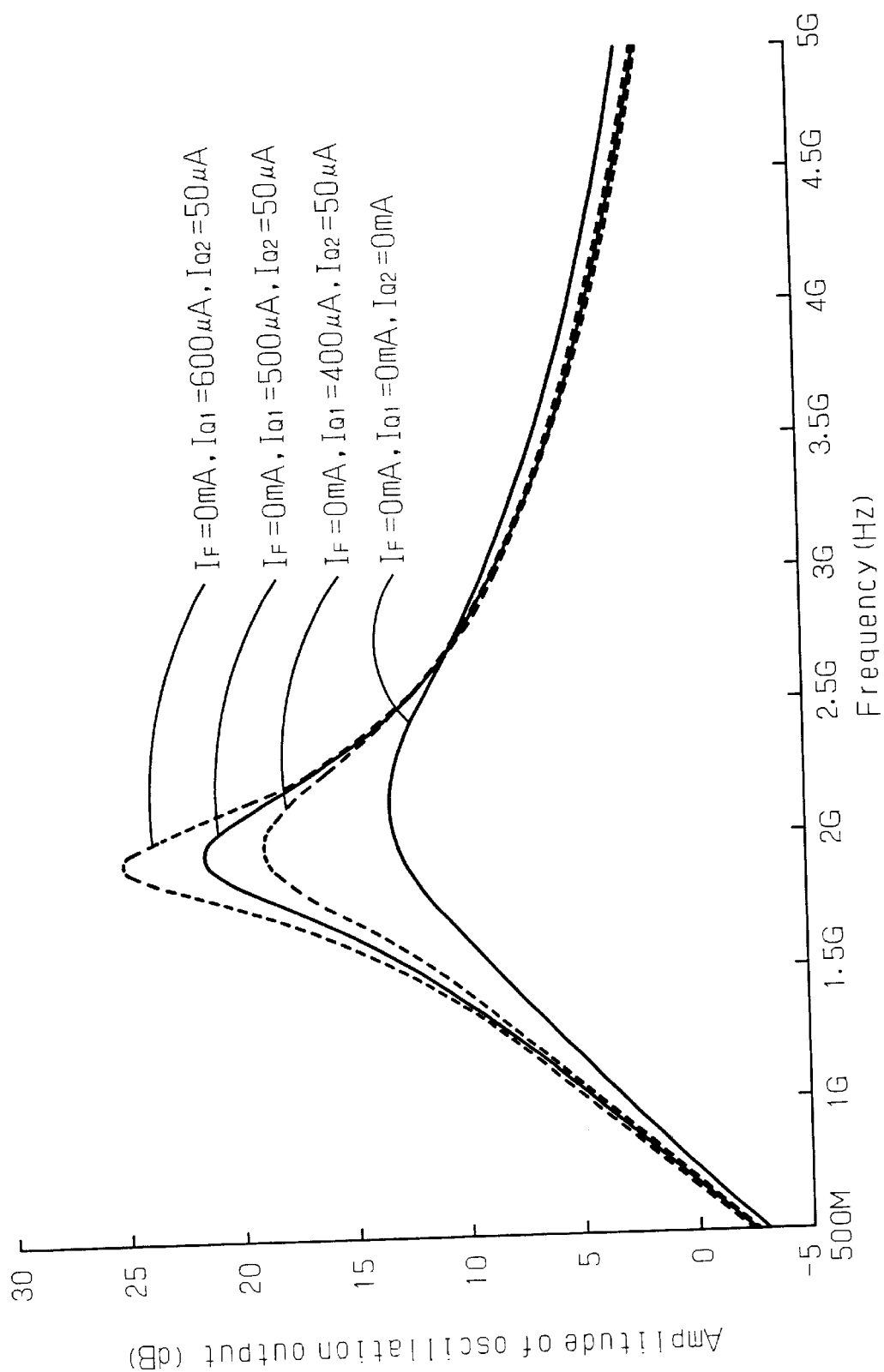
FIG. 9 is a graph showing the result of simulating the oscillation circuit of the present invention.

FIG. 9 shows the result of a simulation where values of currents $I_{Q1}$, $I_{Q2}$ of Q-factor tuning current sources $I_{Q1}$, $I_{Q2}$ are changed with the current $I_F$ that flows in the current source $I_F$ being set to zero in FIG. 2. In this simulation, the ratio of the collector signal amplitude of the transistors $T_{IN1}$, $T_{IN2}$ to the base signal amplitude of the transistors $T_{IN1}$, $T_{IN2}$ was determined by supplying an alternate current signal having a reference amplitude to the base of the transistors $T_{IN1}$, $T_{IN2}$ while cutting off the lead that connected the collector and base of the transistors $T_{IN1}$, $T_{IN2}$ thereby removing the positive feedback loop.

Values of the inductance elements $L_1$, $L_2$ were set to 4nH, capacitance elements $C_1$, $C_2$ were set to 0.6 pF, current sensing resistors $R_{S1}$, $R_{S2}$ were set to 50Ω, and value of the current source $I_{N1}$, was set to 3 mA. Cut-off frequency $f_T$ of the transistor was set to 18 GHz, βf was set to 240, saturation current Is was set to $8.1 \times 10^{-17}$ A, base resistance was set to 44Ω, capacitance between base and emitter with zero bias was set to $1.5 \times 10^{-13}$ F, capacitance between collector and base with zero bias was set to $6 \times 10^{-14}$ F, and capacitance between collector and substrate with zero bias was set to $5.2 \times 10^{-14}$ F. In the simulation, it is desirable to use an approximate model that provides an equivalent representation of parasitic capacitance which is distributed between the elements and the semiconductor substrate with the parasitic capacitance being represented equivalently in accordance with the manufacturing method which is employed, for achieving the coils, capacitance elements and the resistors on a semiconductor integrated circuit. For example, a capacitance element of 0.4 pF and a resistor of 220Ω are connected in series between both terminals of the LC resonance circuit $RC_{11}$ and the LC resonance circuit $RC_{12}$ and the ground of FIG. 2, in this simulation. The resistor has a parasitic capacitance of 0.04 pF per unit area of the resistor pattern mask added thereto between the 2-division neutral point of potential and the ground. The parasitic resistance added between both terminals of the capacitance element and other elements is set to 10Ω.

Result of calculating while changing the frequency from 500 MHz to 5 GHz is shown by plotting the frequency along abscissa and plotting the oscillation output amplitudes $V_{OUT}$ (+), $V_{OUT}$ (−) along the ordinate in decibel (dB).

This result shows that selectivity of the output signal can be increased by increasing the value of current $I_{Q1}$, with respect to current $I_{Q2}$.

Figure 10:
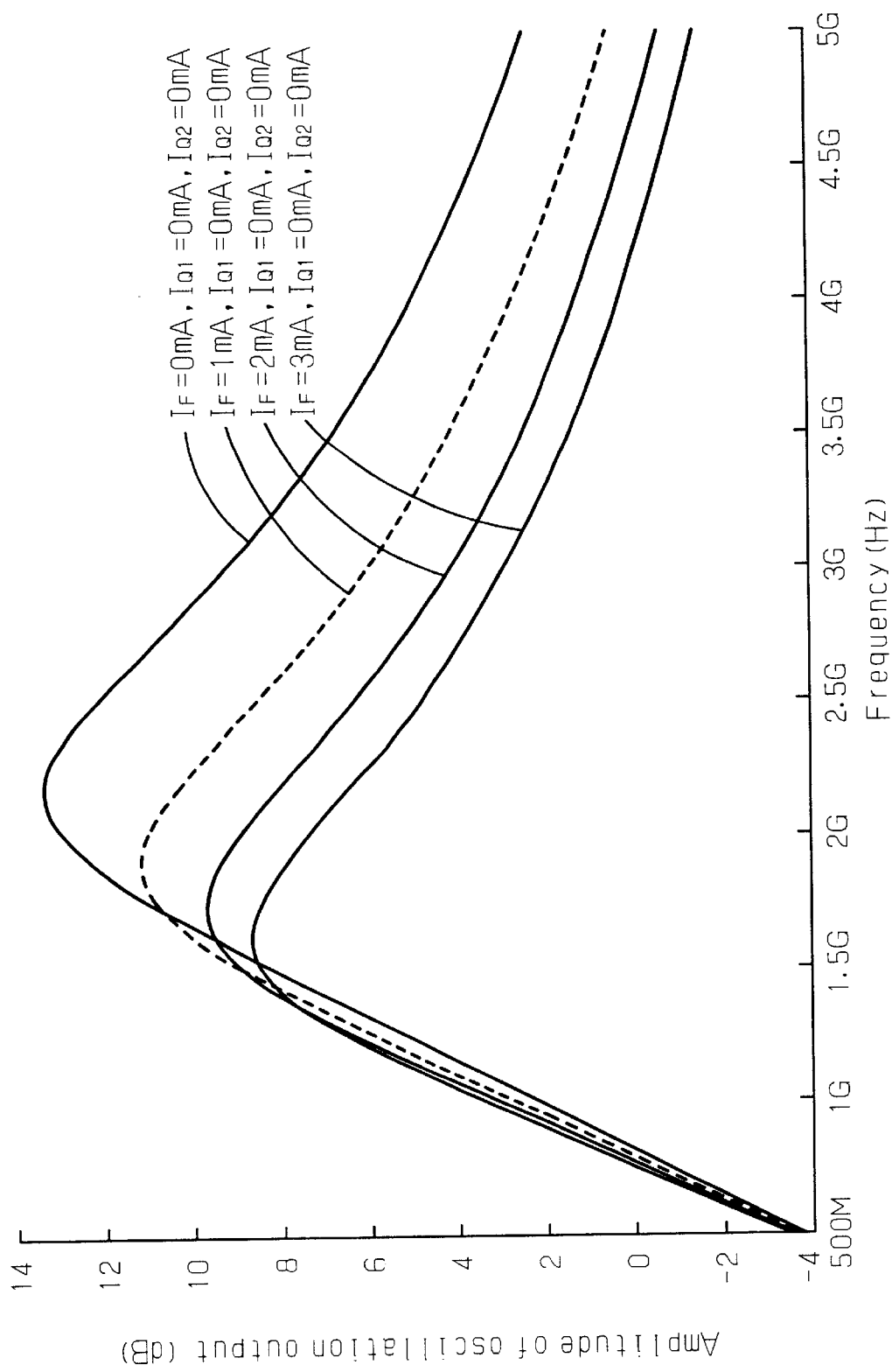
FIG. 10 is a graph showing the result of simulating the oscillation circuit of the present invention.

FIG. 10 shows the result of simulation where the value of current $I_F$ was changed while setting the current $I_{Q1}$ and current $I_{Q2}$ to zero. Other constants are set to the same values as those of FIG. 9.

From this result, it can be understood that increasing the current $I_F$ causes the center frequency to shift toward a lower frequency. Since the value of current $I_{N1}$ is 3 mA, value of the current $I_F$ is desired to be 3 mA or less.

Figure 11:
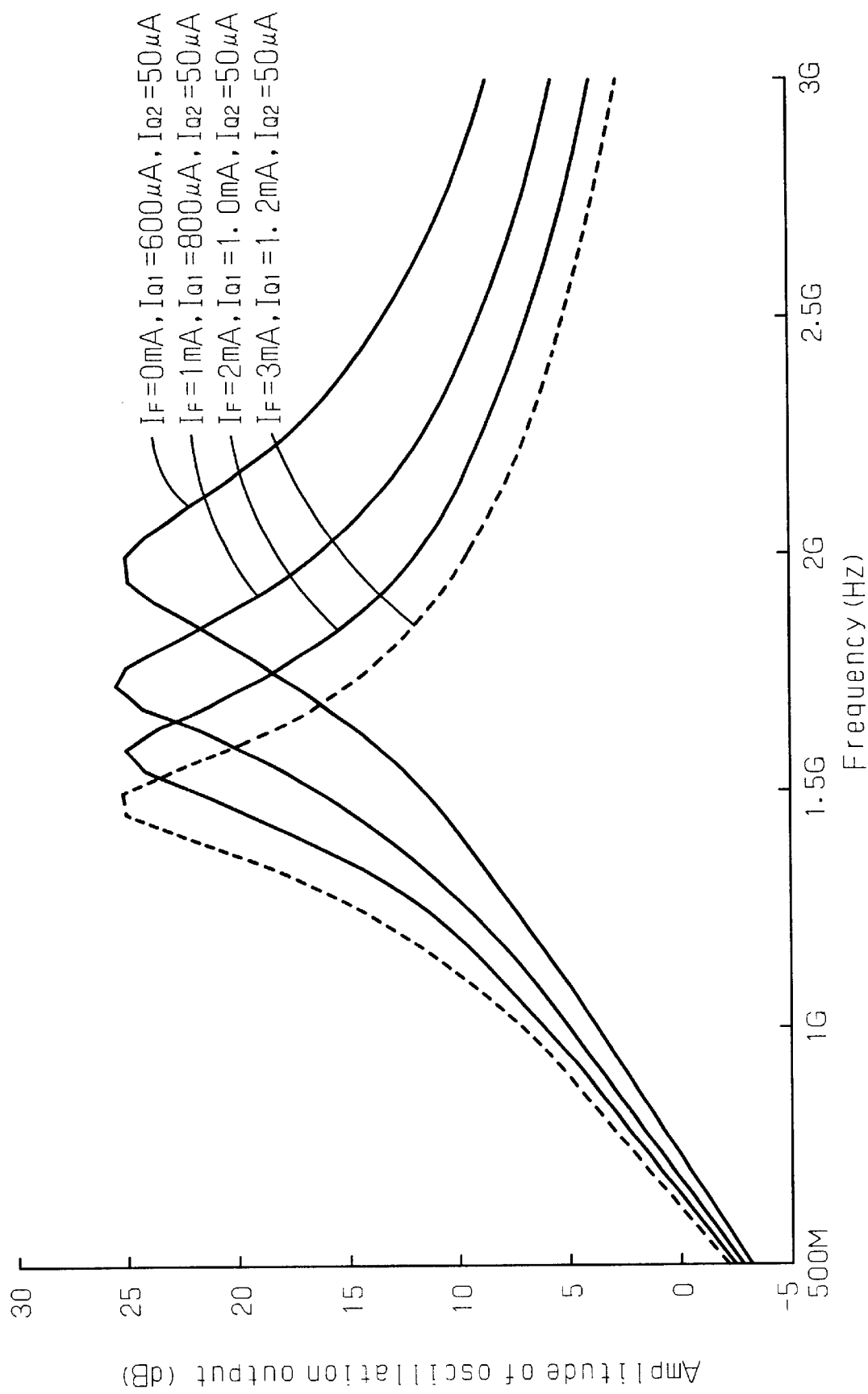
FIG. 11 is a graph showing the result of simulating the oscillation circuit of the present invention.
Figure 12:
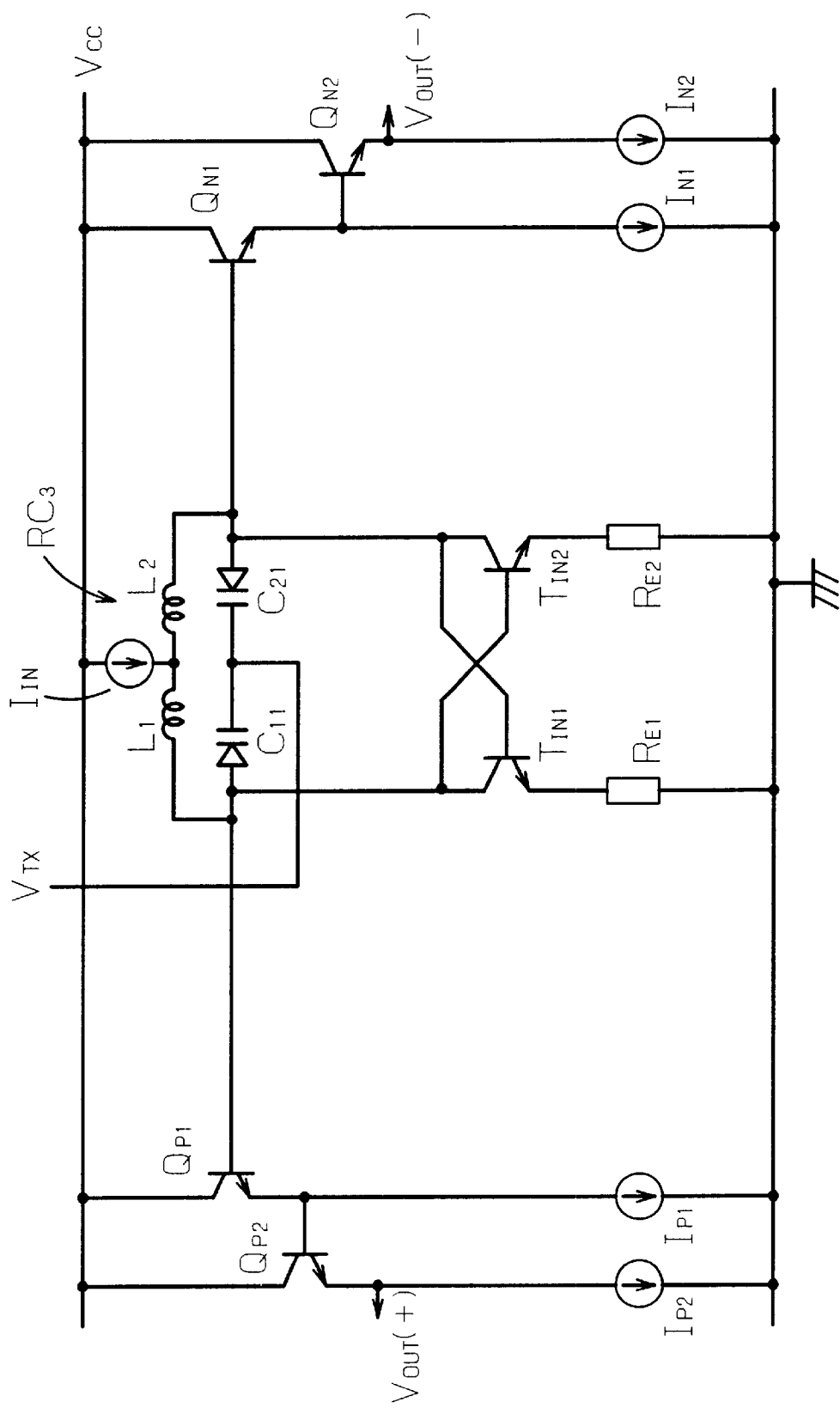
FIG. 12 is a circuit diagram showing the constitution of an oscillation circuit of the prior art.

FIG. 11 shows the result of simulation where the values of current $I_F$ and currents $I_{Q1}$, $I_{Q2}$ were changed. It is shown that peak value of the signal can be made substantially constant and the center frequency can be changed, by selecting proper values.

Specifically, a plurality of discrete values were adopted for the current $I_F$ that flows in the current source of the frequency tuning voltage-current converter circuit $GM_F$. Then for the discrete values of the current $I_F$, value of the current $I_{Q1}$ of the Q-factor tuning voltage-current converter circuit $GM_Q$ was set so as to maintain the peak value of the oscillation output substantially constant. That is, the current $I_{Q2}$ was set to a fixed value and such a ratio of currents was set so that the current $I_{Q1}$ increases by 200 μA when the current $I_F$ increases by 1 mA. Relationship between the current $I_F$ and the current $I_{Q1}$ is given by the voltages applied as voltage $V_{TY}$ and voltage $V_{Q1}$ in FIG. 2. A current of 600 μA is supplied by the voltage $V_{Q1}$. Varying current is given by the collector current of the transistor $T_{Q3}$. Ratio of the current $I_{Q1}$ to the current $I_F$ is given by the ratio of resistance of the resistor $R_{F1}$ and the resistor $R_{Q3}$.

Thus in the region where the discrete values are set, an oscillation output signal with variations in the peak value thereof being suppressed can be output. The current $I_{Q1}$ shown in FIG. 2 is the collector current of the transistor $T_{Q1}$ plus the collector current of the transistor $T_{Q3}$.

The current $I_{Q2}$ is fixed and the current $I_{Q1}$ is variable in the above description of FIG. 11, although the current $I_{Q1}$ may be fixed with the current $I_{Q2}$ made variable, conversely. Or, alternatively, both currents $I_{Q1}$ and $I_{Q2}$ may be varied.

While the embodiments described above are examples of circuits constituted by using bipolar transistors, circuits similar to those of the embodiments described above can also be made by using field effect transistors. Also the oscillation circuit is made by connecting the LC resonance circuit to the collector of the transistor in the embodiments described above, although the oscillation circuit can be made also by connecting the LC resonance circuit to the emitter or base of the transistor.

What is claimed is:

1. An oscillation circuit comprising a 3-terminal active element and an LC resonance circuit, with said LC resonance circuit being connected with two terminals of said 3-terminal active element and an output signal of said 3-terminal active element being fed back to an input terminal of said 3-terminal active element, said oscillation circuit comprising:
   a voltage-current converter circuit that converts a voltage across said LC resonance circuit into an output current and provides output thereof; and
   a current path for supplying the output current of said voltage-current converter circuit to said LC resonance circuit.

2. The oscillation circuit as described in claim 1, wherein said LC resonance circuit comprises:
   an LC resonance main circuit consisting of an inductance element and a capacitance element;
   a current sensing resistor provided in series with said capacitance element; and
   a frequency tuning voltage-current converter circuit that converts the voltage across said current sensing resistor into an output current and provides output thereof, wherein
   a resonance frequency is changed by feeding back the output current of said frequency tuning voltage-current converter circuit to said LC resonance main circuit.

3. An oscillation circuit comprising a pair of transistors that output signals from collectors or drains by inputting signals to bases or gates of a plurality of transistors of which emitters or sources are connected with each other, and a plurality of LC resonance circuits that are ac-grounded on one of the terminals thereof, wherein the other terminals of said LC resonance circuits are connected to either of the same type terminals of the transistors that constitute said pair of transistors, and the signal of the collector or the drain of each transistor of said pair of transistors is fed back to the base or the gate of the other transistor of said pair of transistors, said oscillation circuit comprising:
   a voltage-current converter circuit that converts the voltage across said LC resonance circuit into an output current and provides output thereof, and
   a current path for supplying the output current of said voltage-current converter circuit to said LC resonance circuit.

4. The oscillation circuit as described in claim 2, wherein said LC resonance circuit comprises an inductance element and a capacitance element, said capacitance element is constituted from a varactor diode, and an oscillation frequency is differentiated in accordance with a voltage applied to said varactor diode form the outside.

5. The oscillation circuit as described in claim 3, wherein said LC resonance circuit comprises:
   an LC resonance main circuit consisting of an inductance element and a capacitance element;
   a current sensing resistor provided in series with said capacitance element; and
   a frequency tuning voltage-current converter circuit that converts the voltage across said current sensing resistor into an output current and provides output thereof, wherein
   a resonance frequency is changed by feeding back the output current of said frequency tuning voltage-current converter circuit to said LC resonance main circuit.

6. The oscillation circuit as described in claim 3, wherein said LC resonance circuit comprises an inductance element and a capacitance element, said capacitance element is constituted from a varactor diode, and an oscillation frequency is differentiated in accordance with a voltage applied to said varactor diode from the outside.

7. An oscillation circuit comprising:
   a main portion consisting of a first pair of transistors of which emitters are connected with each other and the base of each transistor is connected to the collector of the other transistor, an LC resonance circuit connected with the collectors of the transistors of said first pair of transistors, and a first current source connected to the emitter of each transistor of said first pair of transistors, while an oscillation signal is output from the collector of each transistor of said first pair of transistors;
   a second pair of transistors of which emitters are connected with each other;
   a third pair of transistors of which emitters are connected with each other;
   a second current source connected to the emitter of both transistors of said second pair of transistors;
   a third current source connected to the emitter of both transistors of said third pair of transistors;
   a first resistor of which one terminal is connected commonly to a collector and a base of one transistor of said second pair of transistors and to a base of one transistor of the third pair of transistors;
   a second resistor of which one terminal is connected commonly to the collector and the base of the other transistor of said second pair of transistors and to the base of the other transistor of the third pair of transistors; and
   connecting means for connecting the other terminals of said first and second resistors and the collector of each transistor of said first pair of transistors respectively, wherein
   Q factor of the oscillation signal of said main portion is differentiated in accordance with a current ratio of said second and third current sources.

8. An oscillation circuit as described in claim 7, wherein said LC resonance circuit comprises an inductance element and a varactor diode, wherein an oscillation frequency is differentiated in accordance with a voltage applied to said varactor diode from the outside.

9. The oscillation circuit comprising:
   a main portion consisting of a first pair of transistors of which emitters are connected with each other and the base of each transistor thereof is connected to the collector of the other transistor thereof, an LC resonance circuit connected with the collectors of the transistors of said first pair of transistors, and a first current source connected to the emitter of both transistors of said first pair of transistors, while an oscillation signal is output at the collector of each transistor of said first pair of transistors;

a resistor that senses the current flowing in an element that constitutes said LC resonance circuit;

a second pair of transistors of which emitters are connected with each other, the base of each transistor thereof is connected to each terminal of said resistor, and the collector of each transistor thereof is connected to the collector of each transistor of said first pair of transistors; and a second current source connected to the emitter of both transistors of said second pair of transistors, wherein an oscillation frequency of said main portion is differentiated in accordance with a current ratio of said first and second current sources.

10. An oscillation circuit comprising an LC resonance circuit consisting of a capacitance element and an inductance element and a 3-terminal active element, with said LC resonance circuit being connected with two terminals of said 3-terminal active element and an output signal of said 3-terminal active element being fed back to an input terminal of said 3-terminal active element, said oscillation circuit comprising:

a voltage-current converter circuit that converts a voltage across said LC resonance circuit into an output current and provides output thereof;

a first current path for supplying the output current of said voltage-current converter circuit to said LC resonance circuit;

an amplifier circuit that senses a current flowing in said capacitance element or said inductance element and outputs an amplified output current; and a second current path for supplying the amplified output current of said amplifier circuit to said LC resonance circuit.

11. The oscillation circuit as described in claim 10, wherein said voltage-current converter circuit and said amplifier circuit differentiate a voltage-current conversion ratio and an amplification gain thereof, respectively, in accordance with signals applied thereto from the outside.

12. An oscillation circuit comprising:

a main portion consisting of a first pair of transistors of which emitters are connected with each other and the base of each transistor thereof is connected to the collector of the other transistor thereof, an LC resonance circuit connected with the collectors of the transistors of said first pair of transistors, and a first current source connected to the emitter of both transistors of said first pair of transistors, while an oscillation signal is output at the collector of each transitor of said first pair of transistors;

a second pair of transistors of which emitters are connected with each other;

a third pair of transistors of which emitters are connected with each other;

a second current source connected to the emitter of both transistors of said second pair of transistors;

a third current source connected to the emitter of both transistors of said third pair of transistors;

a first resistor of which one terminal is connected commonly to a collector and a base of one transistor of said second pair of transistors and to a base of one transistor of the third pair of transistors;

a second resistor of which one terminal is connected commonly to the collector and the base of the other transistor of said second pair of transistors and to the base of the other transistor of the third pair of transistors respectively;

connecting means for connecting the other terminals of said first and second resistors and the collector of each transistor of said first pair of transistors;

a third resistor that senses the current flowing in an element that constitutes said LC resonance circuit;

a fourth pair of transistors of which emitters are connected with each other, the base of each transistor thereof is connected to each terminal of said third resistor, and the collector of each transistor thereof is connected to the collector of each transistor of said first pair of transistors; and a fourth current source connected to the emitter of both transistors of said fourth pair of transistors, wherein an oscillation frequency of said main portion is differentiated in accordance with a current ratio of said first and fourth current sources, and a Q factor of said main portion is differentiated in accordance with a current ratio of said second and third current sources.

13. The oscillation circuit as described in claim 12, wherein a value of current of said fourth current source is differentiated in accordance with a signal supplied from the outside, and a value of current of at least one of said second and third current sources is differentiated in accordance with said signal supplied from the outside respectively.

* * * * *